(12) United States Patent
Kopp et al.

(10) Patent No.: US 11,367,808 B2
(45) Date of Patent: Jun. 21, 2022

(54) RADIATION-EMITTING SEMICONDUCTOR CHIP WITH OVERLAPPING CONTACT LAYERS

(71) Applicant: OSRAM Opto Semiconductors GmbH, Regensburg (DE)

(72) Inventors: Fabian Kopp, Tanjung Tokong Penang (MY); Franz Eberhard, Regensburg (DE); Björn Muermann, Regensburg (DE); Attila Molnar, Gelugor Penang (MY)

(73) Assignee: OSRAM OLED GmbH, Regensburg (DE)

( * ) Notice: Subject to any disclaimer, the term of this patent is extended or adjusted under 35 U.S.C. 154(b) by 1 day.

(21) Appl. No.: 16/216,067

(22) Filed: Dec. 11, 2018

(65) Prior Publication Data

US 2019/0181299 A1     Jun. 13, 2019

(30) Foreign Application Priority Data

Dec. 13, 2017   (DE) ...................... 10 2017 129 783.9

(51) Int. Cl.
*H01L 33/38*     (2010.01)
*H01L 33/24*     (2010.01)
(Continued)

(52) U.S. Cl.
CPC .............. *H01L 33/38* (2013.01); *H01L 33/24* (2013.01); *H01L 33/46* (2013.01); *H01L 33/20* (2013.01); *H01L 2933/0016* (2013.01)

(58) Field of Classification Search
CPC ......... H01L 33/38; H01L 33/24; H01L 33/46; H01L 33/387
(Continued)

(56) References Cited

U.S. PATENT DOCUMENTS 9,105,813 B1 *  8/2015  Chang .................... H01L 33/38
11,164,994 B2 * 11/2021  Kopp ..................... H01L 33/42
(Continued)

FOREIGN PATENT DOCUMENTS

DE   10 2014 114 674 A1   4/2016
DE   10 2015 102 043 A1   8/2016
(Continued)

OTHER PUBLICATIONS

Dr. Rudiger Paschotta, "Bragg Mirrors", 2020, RP Photonics Encyclopedia, https://www.rp-photonics.com/bragg_mirrors.html (Year: 2020).*

*Primary Examiner* — Lex H Malsawma
(74) *Attorney, Agent, or Firm* — DLA Piper LLP (US)

(57) ABSTRACT

A radiation-emitting semiconductor chip includes a semiconductor body; a first contact layer having a first contact surface for external electrical contacting of the semiconductor chip and a first contact web structure connected to the first contact surface, wherein the first contact web structure is a region of the first contact layer that, compared to the first contact surface, has a comparatively small extent at least in a lateral direction; a second contact layer, wherein first and second contact web structures overlap in places in plan view of the semiconductor chip; a current distribution layer; and an insulation layer having a plurality of openings into which the current distribution layer extends.

20 Claims, 8 Drawing Sheets

(51) Int. Cl.
*H01L 33/46* (2010.01)
*H01L 33/20* (2010.01)

(58) Field of Classification Search
USPC ............. 257/98, 99, E33.065, E33.066
See application file for complete search history.

(56) References Cited

U.S. PATENT DOCUMENTS

| | | |
|---|---|---|
| 2010/0155752 A1* | 6/2010 | Lim .................. H01L 33/38 257/94 |
| 2011/0210345 A1 | 9/2011 | Lim et al. |
| 2012/0049234 A1 | 3/2012 | Cheng |
| 2016/0149086 A1* | 5/2016 | Sim .................. H01L 33/62 257/98 |
| 2016/0315225 A1* | 10/2016 | Kageyama ............ H01L 33/38 |
| 2019/0326471 A1* | 10/2019 | Kopp .................. H01L 33/387 |

FOREIGN PATENT DOCUMENTS

| | | |
|---|---|---|
| DE | 10 2015 107 577 A1 | 11/2016 |
| DE | 10 2016 112 587 A1 | 1/2018 |

* cited by examiner

RADIATION-EMITTING SEMICONDUCTOR CHIP WITH OVERLAPPING CONTACT LAYERS

TECHNICAL FIELD

This disclosure relates to a radiation-emitting semiconductor chip.

BACKGROUND

Different geometries are useful for different applications of radiation-emitting semiconductor components such as light-emitting diode semiconductor chips. Semiconductor chips with a large length-to-width ratio are particularly suitable, for example, for side radiation for backlighting or as light sources in LED filaments to replace the filament in a light bulb. However, efficient operation of the semiconductor chips requires good current distribution in the lateral direction. For conventional semiconductor chips with metallic contact structures or transparent conductive layers, this leads to limitations with regard to achievable geometries.

It could therefore be helpful to provide a radiation-emitting semiconductor chip characterized by a high efficiency largely independent of its geometric shape.

SUMMARY

We provide a radiation-emitting semiconductor chip comprising a semiconductor body having an active region that generates radiation; a first contact layer having a first contact surface for external electrical contacting of the semiconductor chip and a first contact web structure connected to the first contact surface; a second contact layer having a second contact surface for external electrical contacting of the semiconductor chip and a second contact web structure connected to the second contact surface, wherein the first contact web structure and the second contact web structure overlap in places in plan view of the semiconductor chip; a current distribution layer through which the first semiconductor layer electrically conductively connects to the first contact layer; and an insulation layer containing a dielectric material, wherein the insulation layer is arranged between the first semiconductor layer and the current distribution layer and has a plurality of openings into which the current distribution layer extends, and a diameter of the openings is 1 µm to 20 µm.

We also provide a radiation-emitting semiconductor chip comprising a semiconductor body having an active region that generates radiation; a first contact layer having a first contact surface for external electrical contacting of the semiconductor chip and a first contact web structure connected to the first contact surface; a second contact layer having a second contact surface for external electrical contacting of the semiconductor chip and a second contact web structure connected to the second contact surface, wherein the first contact web structure and the second contact web structure overlap in places in plan view of the semiconductor chip; a current distribution layer through which the first semiconductor layer electrically conductively connects to the first contact layer; and an insulation layer containing a dielectric material, wherein the insulation layer is arranged between the first semiconductor layer and the current distribution layer and has a plurality of openings into which the current distribution layer extends, and the insulation layer is formed as a filter layer that predominantly transmits incident radiation within a first angular range and predominantly reflects incident radiation within a second angular range.

Figure 1A:
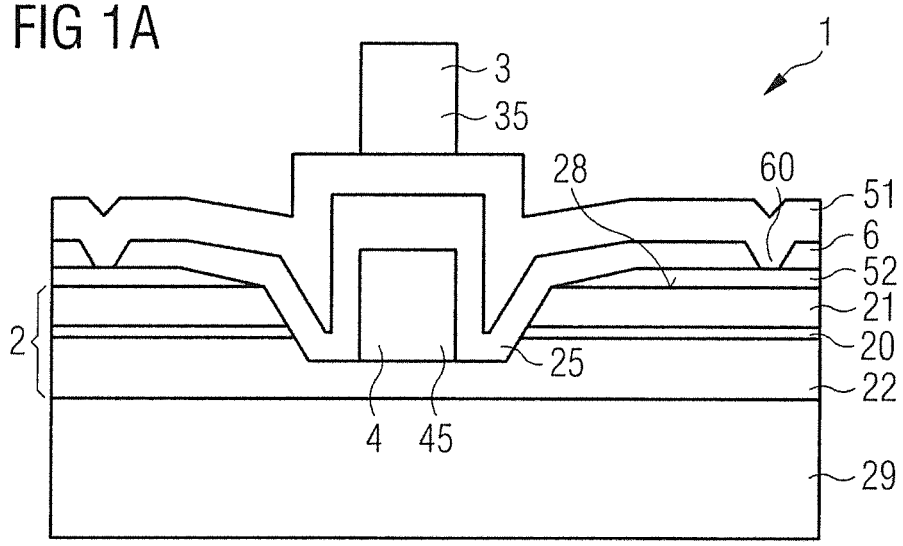
FIGS. 1A, 1B and 1C show an example of a radiation-emitting semiconductor chip in schematic representation of a section of a sectional view (FIG. 1A), in plan view (FIG. 1B) and in an enlarged representation of a section of the sectional view in FIG. 1A (FIG. 1C).

REFERENCE SIGN LIST 1 radiation-emitting semiconductor chip
2 semiconductor body
20 active region
21 first semiconductor layer
22 second semiconductor layer
250 recess
250 side surfaces
28 radiation exit surface
281 partial surfaces
29 carrier
3 first contact layer
31 first contact surface
34 connecting straight line
345 center distance
35 first contact web structure
351 first contact web
351a further first contact web
3510 longitudinal axis of the first contact web
3511 transverse extent of the first contact web
359 node of the first contact web structure
4 second contact layer
41 second contact surface
42 contact-giving layer
43 mirror layer
44 barrier layer
45 second contact web structure
451 second contact web
4510 longitudinal axis of the second contact web
4511 transverse extent of the second contact web
459 node of the second contact web structure
51 current distribution layer
52 connection layer
6 insulation layer
60 opening 65 dielectric mirror layer
650 cutout
7 passivation layer
8 arrow
91 first contact structure
92 second contact structure

DETAILED DESCRIPTION

We provide a radiation-emitting semiconductor chip comprising a semiconductor body. The semiconductor body has an active region that generates radiation. For example, the active range is intended for the generation of radiation in the ultraviolet, visible or infrared spectral range. In particular, the active region is arranged between a first semiconductor layer and a second semiconductor layer, wherein the first semiconductor layer and the second semiconductor layer are different from one another at least in places with respect to their conduction type so that the active region is located in a pn-junction. The first semiconductor layer, the second semiconductor layer and the active region can each be formed as a single-layer or a multi-layer.

The semiconductor chip may have a first contact layer. In particular, the first contact layer has a first contact surface for external electrical contacting of the semiconductor chip. For example, the first contact surface for electrical contacting of the first semiconductor layer is provided. Furthermore, the first contact layer may have a first contact web structure connected to the first contact surface. The first contact web structure is intended for the lateral distribution of charge carriers that are injected over the first contact surface during operation of the radiation-emitting semiconductor chip.

A lateral direction is a direction parallel to a main extension plane of the active region. Accordingly, a vertical direction is perpendicular to the main extension plane of the active region.

The semiconductor chip may have a second contact layer comprising a second contact surface for external electrical contacting of the semiconductor chip. In particular, the second contact layer is intended for electrical contacting of the second semiconductor layer. For example, the second contact layer has a second contact web structure connected to the second contact surface.

Expediently, there is no direct electrical contact between the first contact layer and the second contact layer. In particular, a current path runs between the first contact layer and the second contact layer through the semiconductor body, in particular through the active region.

The first contact web structure and the second contact web structure may overlap at least in places in plan view of the semiconductor chip. Areas in which the first contact web structure and the second contact web structure overlap can be used both for lateral current distribution to contact the first semiconductor layer and for lateral current distribution to contact the second semiconductor layer. For example, at least 10%, at least 30% or at least 90% of the first contact web structure is arranged within the second contact web structure in plan view of the semiconductor chip. The larger this percentage is, the more area of the semiconductor chip, which cannot be used for radiation generation anyway due to the second contact web structure, can also be used for charge carrier distribution over the first contact web structure. Compared to a radiation-emitting semiconductor chip in which the first contact layer and the second contact layer are arranged next to one another without overlapping, the area of the active region covered by the contact layers may be reduced. However, one of the contact layers, for example, the first contact layer, may also have at least one contact web that is free of overlaps with the other, for example, the second contact layer. In contrast, the first contact surface and the second contact surface are arranged without overlapping so that both contact surfaces are accessible for external electrical contacting.

In particular, the first contact web structure may have a number of contact webs greater than or equal to the number of contact webs of the second contact web structure.

A contact web structure is generally understood to be a region of a contact layer that, compared to the contact surface intended for electrical contacting, has a comparatively small extent at least in a lateral direction. Alternatively or in addition, a contact web can, for example, have a greater extent along a lateral direction than in a perpendicular direction thereto. For example, a contact web has a longitudinal axis, wherein a length of the longitudinal axis is at least twice as large, at least five times as large or at least ten times as large as a maximum transverse extent of the contact web perpendicular to the longitudinal axis. The longitudinal axis can be straight, bent or curved. A contact web structure may have one or more contact webs.

The semiconductor chip may have a current distribution layer. The first semiconductor layer connects to the first contact layer via the current distribution layer. For example, the current distribution layer directly adjoins the first contact layer. For example, the first contact layer is completely arranged within the current distribution layer in plan view of the semiconductor chip.

The semiconductor chip may have an insulation layer. The insulation layer, for example, contains a dielectric material. The dielectric material is an electrically weak or non-conductive, non-metallic material, whose charge carriers are generally not freely movable, for example, at the usual operating currents. The insulation layer contains, for example, at least one of the following materials: silicon nitride, silicon dioxide, silicon oxynitride, aluminum oxide, titanium oxide, tantalum oxide, and niobium oxide.

For example, the insulation layer covers at least 30%, about 50%, at least 70% or at least 90% of the entire base area of the semiconductor chip in plan view. For example, the insulation layer covers a maximum of 99% of the entire base area of the semiconductor chip in plan view.

The insulation layer may have a plurality of openings. The current distribution layer extends into the openings. In the production of the semiconductor chip, the position of the openings can be used to determine at which places the current injection on the semiconductor chip is greatest in plan view of the semiconductor chip.

For example, the openings are surrounded by the material of the insulation layer along their entire circumference. For example, the openings are at least partially or completely filled with material from the current distribution layer.

For example, with regard to their distribution density and/or size, the openings are formed such that a uniform lateral current injection is promoted in the semiconductor chip.

For example, a distance between two adjacent openings shall be 5 µm to 60 µm, approximately 20 µm to 50 µm.

A diameter of the openings shall be in particular 0.5 µm to 20 µm, for example, 2 µm to 6 µm. The diameter is the longest lateral extent in a non-round opening.

For example, a distribution density of the openings is preferably 200,000 openings per $mm^2$ to 10 openings per $mm^2$, promoting a laterally uniform and homogeneous current injection in the semiconductor chip.

The openings may also differ in shape and/or size from one another. For example, one or more openings can be provided at the edge of the semiconductor chip that are larger than openings in the middle of the semiconductor chip.

The radiation-emitting semiconductor chip may comprise a semiconductor body having an active region that generates radiation. The semiconductor chip comprises a first contact layer having a first contact surface to electrically contact the semiconductor chip and a first contact web structure connected to the first contact surface. The semiconductor chip comprises a second contact layer having a second contact surface for external electrical contacting of the semiconductor chip and a second contact web structure connected to the second contact surface, wherein the first contact web structure and the second contact web structure overlap in places in plan view of the semiconductor chip. The semiconductor chip comprises a current distribution layer, through which the first semiconductor layer electrically connects to the first contact layer. The semiconductor chip comprises an insulation layer containing a dielectric material, wherein the insulation layer is arranged between the first semiconductor layer and the current distribution layer and having a plurality of openings, into which the current distribution layer extends.

The semiconductor chip may have a connection layer. The connection layer electrically connects to the first contact layer, for example, via the current distribution layer. In particular, the connection layer directly adjoins the semiconductor body, in particular the first semiconductor layer. For example, the connection layer does not directly adjoin the first contact layer at any places.

For example, the insulation layer is arranged in places between the connection layer and the current distribution layer, in particular in the vertical direction. By the insulation layer, a direct vertical current path between the connection layer and the current distribution layer is at least partially prevented.

For example, the insulation layer is arranged vertically between the first contact layer and the second contact layer.

The connection layer and the current distribution layer connect to one another, expediently, in an electrically conductive manner in the region of the openings. The openings thus define, at which place the current distribution layer electrically conductively connects to the connection layer. For example, the connection layer and the current distribution layer adjoin one another in the openings.

In particular, the openings may be the only places where the connection layer and the current distribution layer are adjacent to one another.

The radiation-emitting semiconductor chip may have a length to width ratio of at least 4:1 or at least 6:1. For example, the length-to-width ratio is at least 8:1, at least 15:1, or at least 20:1. For example, the length-to-width ratio is at most 100:1 or at most 50:1. Semiconductor chips with such a length-to-width ratio are particularly suitable, for example, for lateral coupling into a flat light guide, e.g., backlighting a liquid crystal display, or as a light source in an LED filament.

With a right-angled radiation-emitting semiconductor chip, the extent along the longest edge is regarded as the length. In another polygonal semiconductor chip or one at least partially curved in plan view, the length is considered to be the extent along the direction along which the extent is greatest. In this example, the width is given by the maximum extent perpendicular to the direction along which the length is measured.

With the conventional structure for radiation-emitting semiconductor chips, such a high length-to-width ratio cannot be achieved efficiently because the current density distribution is too inhomogeneous. Commercially available radiation-emitting semiconductor chips therefore have a maximum length-to-width ratio of 3:1.

The first contact web structure and/or the second contact web structure may be symmetrically formed, in particular symmetrically to a connecting straight line through the first contact surface and the second contact surface. For example, the first contact web structure and/or the second contact web structure is formed axially symmetrically to the connecting straight line. The connecting straight line can in particular run through the center of area of the first contact surface and/or the second contact surface. The structure of the first contact surface and/or the second contact surface itself need not necessarily be symmetrical to the connecting straight line.

In a contact web structure with an odd number of contact webs, one contact web in particular overlaps with the connecting straight line.

With an even number of contact webs, all contact webs can have at least one partial surface arranged without overlap to the connecting straight line and which, for example, runs parallel to the connecting straight line.

A transverse extent of at least one contact web of the first contact web structure and/or the second contact web structure may decrease with increasing distance from the associated contact surface. The greater the distance from the corresponding contact surface, the lower is the required ampacity for the respective contact web. Such tapered, in particular stacked, current webs can control the current flow in the metallic conductors.

The second contact web structure and the connecting straight line through the first contact surface and the second contact surface may divide a radiation exit surface of the semiconductor body into a plurality of partial surfaces in which a size of the largest partial surface is larger by at most 50%, for example, at most 25% or at most 10%, than a size of the smallest partial surface. In particular, all partial surfaces can be of the same size or essentially the same size. The radiation exit surface is a surface of the semiconductor body running parallel to the main extension plane of the active region and through which a part of the radiated radiation emerges during operation of the radiation-emitting semiconductor chip. For example, the semiconductor chip has a carrier, wherein the semiconductor body is arranged on the carrier and the radiation exit surface is arranged on the side of the semiconductor body facing away from the carrier.

An efficient current extension with a homogeneous current density distribution can be achieved particularly easily and reliably if the resulting partial surfaces of the radiation exit surface differ as little as possible from one another. For example, the second contact web structure and the connecting straight line divide the radiation exit surface into at least four partial surfaces.

In particular, the number of contact webs and the number of formed partial surfaces can be selected as a function of the extent of the radiation-emitting semiconductor chip in the lateral direction, in particular as a function of its width.

The first contact web structure and/or the second contact web structure may have a node from which at least three contact webs branch off. In particular, the first contact surface and/or the second contact surface form the node. In other words, the contact surfaces may be formed in places where there is already a comparatively large amount of material for the first contact layer and/or the second contact layer. The additional material coverage of the radiation exit surface required for the formation of the first contact surface and/or the second contact surface is thus minimized. Overall, the total area required for the first contact layer and/or the second contact layer can be minimized with same good current extent and external electrical contactability via the contact surfaces.

An electrical surface resistance of the current distribution layer may at most be three times or at most twice as large as an electrical surface resistance of the second semiconductor layer. For example, the electrical sheet resistance of the current distribution layer is at most 50%, at most 20% or at most 10% higher than the electrical sheet resistance of the second semiconductor layer. The sheet resistance is typically given in $\Omega/\square$ and calculated from the specific resistance of the material used and the layer thickness. The smaller the differences in electrical sheet resistance, the more uniform is the injection of charge carriers from opposite sides into the active region.

A center distance between the first contact surface and the second contact surface may be at least one fifth of the length of the semiconductor chip. This applies in particular to when at least part of the first contact web structure is further away from the second contact surface than the first contact surface or vice versa.

At least one contact web may extend from the first contact surface in a direction away from the second contact surface or vice versa. In particular, the contact web may extend in the opposite direction.

The insulation layer may cover at least 30% of the area of the connection layer. For example, the insulation layer covers at least 50%, at least 70% or at least 90% of the connection layer. The insulation layer can therefore cover a large area of the connection layer. For example, the insulation layer covers the connection layer by a maximum of 95% or 99%.

The insulation layer may be formed as a filter layer that predominantly transmits incident radiation within a first angular range and predominantly reflects incident radiation within a second angular range. "Predominantly" means in particular that at least 60% of the radiation is transmitted or reflected.

In particular, the angles of the first angular range relative to the vertical direction are smaller than the angles of the second angular range. Radiation incident on the insulation layer at comparatively steep angles is therefore predominantly transmitted, while radiation incident at comparatively flat angles is predominantly reflected. Radiation components that could not be coupled out from the semiconductor chip anyway due to a comparatively flat course are therefore already retained at the insulation layer. Radiation absorption losses in layers downstream of the insulation layer, for example, in the current distribution layer, can thus be reduced.

For example, the boundary between the first angular range and the second angular range is determined by the critical angle of total reflection that can be derived from the refractive index of the semiconductor body and the refractive index of the surrounding medium. The first angular range includes angles smaller than this limit. The second angular range, on the other hand, includes angles that are larger than this limit.

The insulation layer that in particular is formed as a filter can consist of a single layer. This means in particular that the insulation layer is homogeneous and, for example, made of a single dielectric material. The dielectric material has the advantage of an adapted refractive index, where "adapted" means that the refractive index of the dielectric material is greater than or equal to the refractive index of a medium surrounding the insulation layer. The surrounding medium is subordinated to the insulation layer starting from the semiconductor body. The surrounding medium comprises elements that enclose the semiconductor body and in particular have a protective function. For example, the semiconductor body can have a passivation layer and/or encapsulation as the surrounding medium.

Alternatively, the insulation layer formed in particular as a filter layer, is multi-layered and has at least two sublayers that differ from one another in their refractive index. Preferably, the filter layer comprises a layer sequence of alternating sublayers with higher refractive index and lower refractive index. In particular, the sublayers with a higher refractive index have a lower thickness than the sublayers with a lower refractive index.

Preferably, the insulation layer formed in particular as a filter layer has a thickness of 400 nm to 800 nm. When dimensioning the thickness of the insulation layer, care must be taken on the one hand to limit the production effort, which is greater with a multi-layer structure of the insulation layer than with a single-layer structure and, on the other hand, to achieve the desired filter characteristic that can be better achieved with a multi-layer structure than with a single-layer structure. With a thickness of 400 nm to 800 nm, a suitable compromise between manufacturing effort and filter characteristics can be achieved.

The insulation layer may be adjacent to the connection layer and the current distribution layer. Between the connection layer and the current distribution layer there are no other layers in the vertical direction apart from the insulation layer, at least in places. In other words, the insulation layer is at least in places the only layer arranged between the connection layer and the current distribution layer.

The connection layer may have a smaller thickness than the current distribution layer. For example, the current distribution layer is at least twice as thick as the connection layer. For example, a thickness of the connection layer shall be 3 nm to 30 nm, approximately 5 nm to 25 nm. For example, a thickness of the current distribution layer is 30 nm to 200 nm, approximately 50 nm to 150 nm. In particular due to the greater thickness, the current distribution layer is characterized by a greater transverse conductivity than the connection layer. In contrast, the connection layer also has lower absorption losses for the radiation passing through the connection layer due to its lower thickness.

Radiation absorption losses in the current distribution layer can be reduced by the insulation layer that acts in particular as a filter layer. In other words, the combination of a connection layer and a current distribution layer and, in particular, an insulation layer arranged in places in the vertical direction between them, a high transverse conductivity with low absorption losses at the same time is achieved.

At least 50% of the total area of the second contact web structure may overlap the first contact web structure. In other words, at least half of the area covered by the second contact web structure is also used for current distribution via the first contact web structure.

The semiconductor body may have at least one recess extending from the radiation exit surface through the active region. In particular, the second contact layer electrically connects to the semiconductor body in the recess. For example, the second contact layer directly adjoins the semiconductor body, in particular the second semiconductor layer. For example, material of the insulation layer and/or material of the current distribution layer is arranged at least in places in the recess.

However, the recess can also be completely filled with material from the second contact layer.

The insulation layer may be arranged between the first contact layer and the second contact layer. The insulation layer also serves as an electrical separation between the first and second contact layers so that there is no direct current path between these contact layers.

There may be no direct vertical current path between the first contact layer and the semiconductor body at any place of the semiconductor chip. A charge carrier injection from the first contact layer into the semiconductor body is therefore not carried out directly below the first contact layer, but at a distance from it in the lateral direction. This reduces the amount of radiation generated in the active region directly below the first contact layer and prevented from escaping by the first contact layer.

A dielectric mirror layer may be arranged in places between the semiconductor body and the current distribution layer. For example, the dielectric mirror layer comprises a plurality of layer pairs, the layers of the layer pairs being different from one another with respect to their refractive indices. For example, the dielectric mirror layer has between and including three and including ten sublayers, wherein adjacent sublayers differing in their refractive index from one another. Preferably, the dielectric mirror layer comprises a layer sequence of alternating sublayers with higher refractive index and lower refractive index. In particular, the sublayers with a higher refractive index have a lower thickness than the sublayers with a lower refractive index.

In particular, the dielectric mirror layer is intended to avoid absorption losses at the first and/or second contact layer.

The dielectric mirror layer particularly covers the side surfaces of the recesses in places. For example, the dielectric mirror layer is arranged vertically in places between the connection layer and the current distribution layer, in particular between the connection layer and the insulation layer. This prevents radiation from escaping from the semiconductor body at the side surface of the recess and subsequently causing absorption losses at the first contact layer and/or the second contact layer.

The dielectric mirror layer may overlap in places with the first contact layer and the second contact layer in plan view of the semiconductor chip. Radiation absorption can thus be avoided or at least reduced both at the first contact layer and at the second contact layer.

The connection layer and/or the current distribution layer may contain a TCO material.

Transparent conductive oxides (TCO) are transparent conductive materials, usually metal oxides such as zinc oxide, tin oxide, cadmium oxide, titanium oxide, indium oxide or indium tin oxide (ITO). In addition to binary metal oxygen compounds such as $ZnO$, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conducting oxides also belong to the group of TCOs. Furthermore, the TCOs do not necessarily correspond to a stoichiometric composition and can also be p- or n-doped.

The connection layer and the current distribution layer can be made of the same material. Alternatively, the connection layer and the current distribution layer can also have material compositions different from one another. For example, the contact layer may be selected for good contact resistance to the semiconductor body and/or the current distribution layer for high transmission of radiation generated in the active region.

The dielectric mirror layer may be arranged in places between the semiconductor body and the second contact layer. For example, the dielectric mirror layer has a cutout in which the second contact layer directly adjoins the semiconductor body. By the dielectric mirror layer, it can be avoided, at least in places, that radiation generated in the active region is absorbed by the second contact layer.

The second contact layer may have a mirror layer. For example, silver or aluminum is suitable for the mirror layer. Silver can be used to achieve particularly high reflectivities in the visible spectral range. For example, the mirror layer has a thickness of 300 nm to 2 µm.

The second contact layer may have a contact-giving layer. The contact-giving is intended to establish a good ohmic contact to the semiconductor body, in particular to the second semiconductor layer. For example, the contact-giving has a thickness of 3 nm to 100 nm. The contact-giving is arranged in particular between the mirror layer and the second semiconductor layer. A material that in itself would form a comparatively poor contact with the semiconductor body such as silver to n-type nitride compound semiconductor material, is also suitable for the mirror layer. For example, the contact-giving layer contains a TCO material such as ITO or ZnO. In particular with a TCO material for the contact-giving layer and silver for the mirror layer, a contact layer can be realized, which is characterized by a high reflectivity and at the same time a good electrical contact to the second semiconductor layer.

The second contact layer may have a barrier layer. In particular, the mirror layer is arranged between the contact-giving layer and the barrier layer. For example, a metal such as Ti, Pt, Cu or Au or a TCO material such as ITO or ZnO is suitable as a barrier layer. For example, the barrier layer has a thickness of 30 nm to 400 nm. The mirror layer can be encapsulated by the barrier layer. A material with a risk of migration, for example, due to moisture is therefore also suitable for the mirror layer.

The mentioned materials and/or at least one or all layers can also be used for the first contact layer.

In particular, the following effects can be achieved with the radiation-emitting semiconductor chip described.

The regions are reduced in which a metal layer such as the first contact layer or the second contact layer is directly adjacent to the semiconductor chip. This increases the brightness of the radiation-emitting semiconductor chip at the same operating current.

The insulation layer reduces absorption losses, in particular in the current distribution layer. Even when a comparatively thick current distribution layer is used with regard to high transverse conductivity or low surface resistance, absorption losses are reduced by the insulation layer. In particular, the insulation layer can fulfil the function of an angle-selective filter layer.

The regions in which the highest current density occurs during operation of the semiconductor chip can be adjusted by at least one opening in the insulation layer. In particular, these regions can be laterally spaced from the first contact layer. For example, the areas where the highest current density occurs can also be laterally spaced from the first contact web structure.

As a result, the amount of light generated in the active region increases and the loss of efficiency at high operating currents (also known as "droop") is reduced. A higher current density distribution and a resulting homogeneous light distribution on the radiation exit surface of the semiconductor chip also increases the efficiency of a downstream arranged radiation conversion material that further increases the brightness of a component with such a radiation-emitting semiconductor chip.

All in all, there is great freedom with regard to the geometry of the semiconductor chip. In particular, efficient semiconductor chips with a large area of the radiation exit surface and/or a particularly large length-to-width ratio can also be realized. The length of the semiconductor chip is limited only by the current distribution in the typically metallic conductors, i.e., the first and second contact layers. The ampacity and the current distribution can be increased by increasing the cross-section of these contact layers, in particular in the region of the contact web structures so that almost any scaling of the semiconductor chip is possible. At the same time, a more homogeneous current density distribution can be achieved in the active region, in particular by positioning and dimensioning the openings.

The efficiency of the semiconductor chip can be further increased by the spatial structure of the contact web structures, in particular adapted to the dimensioning of the semiconductor chip.

Furthermore, absorption losses at the second contact layer can also be avoided, for example, by the dielectric mirror layer. By an arrangement of the dielectric mirror layer on a side surface of the semiconductor chip, for example, on the side surface of the recess, absorption losses on the second contact layer can be further avoided or at least reduced.

The second contact layer itself can be characterized by particularly low absorption losses, in particular by a multi-layer structure with a contact-giving and a mirror layer. Migration effects can be suppressed by the barrier layer so that the freedom in the choice of material for the mirror layer is increased.

Further examples and expediencies result from the following description of the examples in connection with the figures.

Same, similar or seemingly similar elements are provided in the figures with the same reference signs.

The figures are schematic representations and therefore not necessarily true to scale. Rather, comparatively small elements and, in particular, layer thicknesses can be displayed exaggeratedly large for clarification.

Figure 1B:
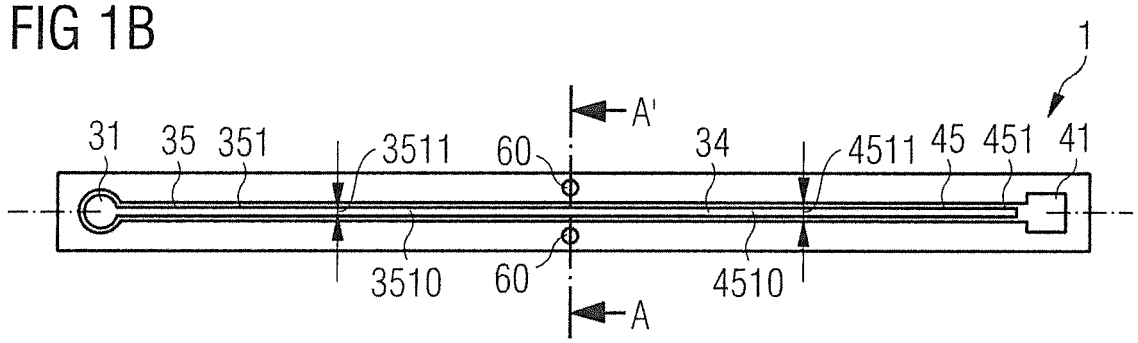
Figure 1C:
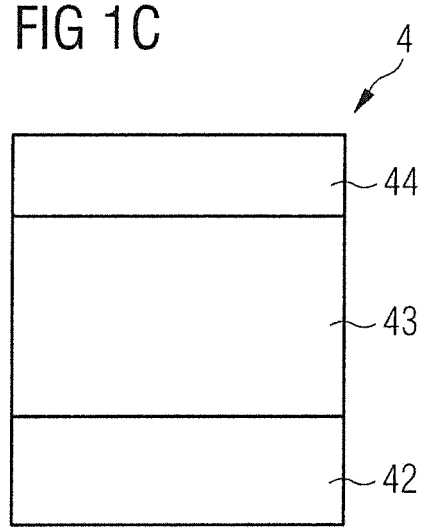

FIGS. 1A, 1B and 1C show an example of a radiation-emitting semiconductor chip 1, where FIG. 1A shows a section of the semiconductor chip in sectional view along the line AA' shown in the plan view in FIG. 1B.

The radiation-emitting semiconductor chip 1 has a semiconductor body 2 with a semiconductor layer sequence. The semiconductor body 2 in particular comprises an active region 20 that generates radiation and is arranged between a first semiconductor layer 21 of a first conduction type (for example, p-conducting) and a second semiconductor layer 22 of a second conduction type (for example, n-conducting) different from the first conduction type. The semiconductor body 2, in particular the active region 20, is preferably based on an III-V compound semiconductor material, in particular a nitride compound semiconductor material.

"Based on nitride compound semiconductor material" means that at least one layer of the semiconductor regions comprises a nitride III/V compound semiconductor material, preferably $Al_nGa_mIn_{1-n-m}N$, wherein $0 \leq n \leq 1$, $0 \leq m \leq 1$ and $n+m \leq 1$. Thereby, this material does not necessarily have to have a mathematically exact composition according to the above formula. Rather, it may contain one or more dopants and additional components that essentially do not alter the characteristic physical properties of the $Al_nGa_mIn_{1-n-m}N$ material. For simplicity's sake, however, the above formula contains only the essential components of the crystal lattice (Al, Ga, In, N), even if these may be partially replaced by small amounts of other substances.

The semiconductor body 2 is arranged on a carrier 29. In particular, the carrier is a growth substrate for the semiconductor layer sequence of the semiconductor body. For a semiconductor body based on nitride compound semiconductor material, sapphire, silicon carbide or gallium nitride are suitable as growth substrates.

A first contact layer 3 and a second contact layer 4 are arranged on a radiation exit surface 28 facing away from the carrier 29. The first contact layer 3 has a first contact surface 31 for the external electrical contacting of the first semiconductor layer 21. The second contact layer 4 has a second contact surface 41 intended for the external electrical contacting of the second semiconductor layer.

The first contact layer 3 also has a first contact web structure 35 connected to the first contact surface 31. Accordingly, the second contact layer 4 has a second contact web structure 45 electrically conductively connected to the second contact surface 41.

In the example shown in FIG. 1B, the first contact web structure 35 comprises a first contact web 351 and the second contact web structure 451 comprises a second contact web 451 that emanate from the associated first contact surface 31 and second contact surface 41, respectively. The shape and number of contact webs can be varied within wide limits. This is explained in more detail in FIGS. 3 to 8C. The number of contact webs of the first contact web structure 35 and the second contact web structure 45 may also be different. For example, the number of contact webs of the first contact web structure is greater than the number of contact webs of the second contact web structure.

The first contact web structure 35 and the second contact web structure 45 overlap in plan view on the radiation-emitting semiconductor chip. In this way, areas of the semiconductor chip in which the active region 20 is already removed for formation of the second contact web structure 45 can also be used for current distribution for electrical contacting of the first semiconductor layer 21.

Deviating from the example described, the first contact web structure 35 and the second contact web structure 45 can overlap to a smaller percentage. For example, the first contact web structure 35 may have at least one contact web that does not overlap with the second contact web structure 45 by at least half of its main axis of extension.

The second contact layer 4, in particular the second contact web structure 45, adjoins the second semiconductor layer 22 in a recess 25 of the semiconductor body. By the recess, the second semiconductor layer 22 covered by the first semiconductor layer 21 is exposed in places for contacting with the second contact layer 4.

An insulation layer 6 is arranged between the first contact layer 3 and the second contact layer 4 in the vertical direction. The insulation layer 6 covers the radiation exit surface 28 of the semiconductor body 2 in some places. In the example shown, the insulation layer 6 also covers the side surfaces 250 of the recesses 25.

The semiconductor chip 1 also comprises a current distribution layer 51 that is electrically conductively connects to the first contact layer 3. The first semiconductor layer 21 electrically connects to the first contact layer 3 via the current distribution layer 51.

Furthermore, the radiation-emitting semiconductor chip 1 comprises a connection layer 52. The connection layer 52 electrically conductively connects to the first contact layer via the current distribution layer 51. Between the current distribution layer 51 and the connection layer 52 the insulation layer 6 is arranged in places, in particular seen in vertical direction.

Insulation layer 6 has a plurality of openings 60 in which the current distribution layer 51 and the connection layer 52 are adjacent to one another. During operation of the radiation-emitting semiconductor chip, the current density injected into the semiconductor chip is highest in a region vertically below the openings 60. The openings in the insulation layer 6 can therefore be used to define the regions in which the current density is highest. Without an insulation layer between the current distribution layer 51 and the first semiconductor layer, in particular between the current distribution layer and the connection layer 52, which may be present, the current density would be highest in the region around the first contact layer 3. In lateral regions further away from the first contact layer 3, however, only a comparatively small charge carrier injection would occur. A further lateral current distribution can take place from the openings via the connection layer 52.

The openings 60 are arranged in lateral direction such that in lateral direction a homogeneous current density distribution is achieved. In particular, the arrangement of the openings on the radiation exit surface 28 is also selected on the basis of the respective material parameters of the current distribution layer 51 and the connection layer 52 such that the current density distribution is as homogeneous as possible. For example, the density, size or position of the openings can be varied, in particular depending on the geometric shape of the semiconductor chip and the structure of the first contact web structure 35 and the second contact web structure 45. In FIG. 1B only the two openings 60 arranged in the region of the sectional view of FIG. 1A are shown explicitly for simplified representation.

For example, edge regions of the radiation exit surface 28 can be provided with more openings than central regions of the radiation exit surface. The distances between the openings may be 20 µm to 50 µm. A suitable diameter of the openings shall be in particular 1 µm to 15 µm, approximately 2 µm to 6 µm.

Despite the openings 60, the insulation layer 6 can cover a large area of the connection layer such as at least 30%, at least 50% or at least 70% of the area of the connection layer in plan view of the semiconductor chip. For example, the insulation layer does not cover more than 90% or 95% of the connection layer 52.

The connection layer 52 is less thick than the current distribution layer 51. Unlike the current distribution layer 51, the connection layer 52 does not have to have a high transverse conductivity. Due to the comparatively small thickness of the connection layer 52, absorption losses in the connection layer can be reduced.

As seen from the active region 20, the insulation layer 6 is arranged in front of the current distribution layer 51 at least in places. In particular, the insulation layer 6 can fulfill the function of a filter layer, wherein the filter layer has a higher reflectivity for radiation at comparatively large angles to the normal to the main extension plane of the active region 20 than for radiation at a comparatively small angles to the normal. As a result, radiation components that could not escape from semiconductor chip 1 anyway due to total reflection can already be reflected largely loss-free at the insulation layer 6. Absorption losses in the current distribution layer 51 can thus be reduced. For example, the insulation layer can cover at least 50%, about 70% or at least 90% of the entire base area of the semiconductor chip in plan view. Absorption losses can thus be avoided particularly efficiently by the insulation layer 6.

In particular, for radiation in a first angular range, the transmission can be increased compared to a conventional semiconductor chip. The first angular range refers to angles $\alpha$ with $0° \leq \alpha \leq \alpha_{tot}$, wherein $\alpha_{tot}$ is the critical angle of total reflection. At angles $\alpha$ that are larger than the critical angle $\alpha_{tot}$, i.e., in a second angular range with $\alpha_{tot} \leq \alpha \leq 90°$, absorption of the described semiconductor chip is considerably reduced compared to a conventional semiconductor chip. The first angular range represents a conical area with a main axis parallel to the vertical direction. The critical angle of the total reflection $\alpha_{tot}$ is determined from the refractive index of the semiconductor body 2 and the refractive index of the surrounding medium, wherein, for example, a critical angle $\alpha_{tot} = \arcsin(1.55/2.5) = 38.3°$ is obtained for a semiconductor body 2 formed from GaN with a refractive index n=2.5 and an surrounding medium with a refractive index n=1.55.

A particularly efficient filter effect can be achieved by a multi-layer structure of the insulation layer with an alternating arrangement of layers with a lower and higher refractive index. However, a filter effect can also be achieved with a single-layer insulation layer.

An electrical sheet resistance of the current distribution layer 51 is preferably at most three times or at most twice as large as an electrical sheet resistance of the second semiconductor layer 22. In particular, the electrical sheet resistance of the current distribution layer 51 is at most 50% or at most 20% higher than the electrical sheet resistance of the second semiconductor layer. The current distribution on the n-side, i.e., on the second semiconductor layer 22, and on the p-side, i.e., on the first semiconductor layer 21, is preferably as symmetrical as possible.

For example, an electrical sheet resistance of the current distribution layer 51 is 8Ω/☐ to 45Ω/☐ has a maximum of 15Ω/☐ or 10Ω/☐. Such low electrical resistances of the current distribution layer 51 can be realized by a comparatively high thickness of the current distribution layer 51. In particular, the insulation layer 6 described in connection with FIG. 1A can also be used to achieve a comparatively large layer thickness for the current distribution layer 51 and thus a low electrical surface resistance without suffering excessive absorption losses.

On the side facing away from the carrier 29, the radiation-emitting semiconductor chip 1 can be closed in places by a passivation layer 7. The passivation layer serves in particular to protect the semiconductor body from external stresses such as moisture, dust or mechanical stress.

The current distribution layer 51 and the connection layer 52 may each be formed from the same material or have different materials from one another. Preferably, the current distribution layer and the connection layer contain a TCO material such as ITO.

The first contact layer 3 and the second contact layer 4 or at least a partial layer thereof can each be formed metallic. This simplifies external electrical contacting of the semiconductor chip 1.

A possible multilayer design of the second contact layer 4 is shown schematically in FIG. 1C.

The second contact layer consists of a contact-giving layer 42, a mirror layer 43 and a barrier layer 44.

For example, silver or aluminum is suitable for the mirror layer. Silver can be used to achieve particularly high reflectivities in the visible spectral range. For example, the mirror layer has a thickness of 300 nm to 2 µm.

A good ohmic contact to the semiconductor body can be formed by the contact-giving layer 42, in particular also when using a material for the mirror layer 43, which in itself would form a comparatively bad contact to the semiconductor body such as silver to n-conducting nitride compound semiconductor material. For example, the contact-giving layer has a thickness of 3 nm to 100 nm. The contact-giving layer is arranged in particular between the mirror layer and the second semiconductor layer. For example, the contact-giving layer contains a TCO material such as ITO or ZnO. In particular with a TCO material for the contact-giving layer and silver for the mirror layer, the second contact layer 4 can be characterized by a high reflectivity and at the same time a good electrical contact to the second semiconductor layer.

A metal such as Ti, Pt, Cu or Au or a TCO material such as ITO or ZnO is suitable for the barrier layer 44. For example, the barrier layer has a thickness of 30 nm to 400 nm. The barrier layer can be used to encapsulate the mirror layer 43. A material with a risk of migration, for example, due to moisture is therefore also suitable for the mirror layer, in particular silver.

The first contact layer 3 can also be formed multi-layered and have at least one of the materials described in connection with the second contact layer.

In FIG. 1B, the first contact web structure 35 has exactly one first contact web 351. The second contact web structure 45 has exactly one second contact web 451. The first contact web structure 35 extends completely within the second contact web structure 45 in a plan view of the radiation-emitting semiconductor chip.

The first contact surface 31 and the second contact surface 41 differ from one another with regard to their basic geometric shape so that the polarity of the semiconductor device can be easily recognized optically by the basic shape of the contact surfaces. For example, the first contact surface is 31 circular and the second contact surface 41 square or vice versa. Such a polarity marking can, however, also be in another form or omitted.

The first contact web 351 has a longitudinal axis 3510. Vertically to the longitudinal axis, the first contact web 351 has a transverse extent 3511. In the example shown, the transverse extent 3511 is constant over the length of the longitudinal axis 3510 of the first contact web.

Accordingly, the second contact web 451 has a longitudinal axis 4510 and a transverse extent 4511 perpendicular to the longitudinal axis.

In plan view of the radiation-emitting semiconductor chip 1, the first contact web structure 35 extends completely within the second contact web structure 45. Thus, regions of the radiation-emitting semiconductor chip that cannot anyway be used for radiation generation due to the active region 20 removed for the structure of the second contact structure, are also used at least partially for the first contact web structure 35 so that no further shading of a radiation exit surface 28 of the semiconductor body 2 is required for to form the first contact web structure 35.

The longitudinal axis of the first contact web 3510 and the longitudinal axis of the second contact web 4510 run congruently along a connecting straight line 34, which runs through the first contact surface 31 and the second contact surface 41, in particular through their center of area.

The first contact web structure 35 and the second contact web structure 45 are formed axially symmetrically with respect to the connecting straight line 34.

The semiconductor chip shown in FIG. 1B has an exemplary length-to-width ratio of about 14:1. Due to the described overlapping arrangement of the contact web structures, in particular in connection with the openings 60 in the insulation layer 6, almost any length-to-width ratios can be achieved, in particular length-to-width ratios of at least 8:1, at least 15:1 or at least 20:1.

The number of contact webs of the first contact web structure 35 and/or the second contact web structure 45 can be selected in particular depending on the area of the radiation-emitting semiconductor chip and the length-to-width ratio.

For example, the radiation-emitting semiconductor chip has one contact web at a length-to-width ratio of 1:1 to 20:1 and an area of 0.05 to 0.5 mm$^2$. For example, for an area of 0.25 to 0.5 mm$^2$ and a length-to-width ratio of 1:1 to 5:1, the number of contact webs is 2; for an area of the semiconductor chip of 0.5 to 1.2 mm$^2$ and a length-to-width ratio of 1:1 to 2:1, the number of contact webs is 3. For example, if the area of the semiconductor chip is 1.2 to 2 mm$^2$ and the length-to-width ratio is 1:1 to 2:1, the number of contact webs is 4; if the area of the semiconductor chip is more than 2 mm$^2$ and the length-to-width ratio is 1:1 to 2:1, the number of contact webs is 5 or more.

The first contact surface 31 and/or the second contact surface 42 need not necessarily be formed symmetrically to the axis of symmetry. For example, the axis of symmetry can run through the second contact surface 41 while the first contact surface 31 is displaced transverse to the axis of symmetry, or vice versa.

The second example shown in FIG. 2A essentially corresponds to the first example described in connection with FIGS. 1A, 1B and 1C.

In contrast, the radiation-emitting semiconductor chip 1 also has a dielectric mirror layer 65. The dielectric mirror layer 65 is arranged in places between the semiconductor body 2 and the first contact layer 3. In particular, the dielectric mirror layer 65 overlaps with the first contact layer 3 and the second contact layer 4. The dielectric mirror layer 65 has a cutout 650, in which the second contact layer 4 adjoins the semiconductor body 2, in particular the second semiconductor layer 22. The dielectric mirror layer 65, for example, has a plurality of layer pairs, with the layers of a layer pair each having different refractive indices from one another. The materials specified for the insulation layer in the general part of the description are particularly suitable for the dielectric mirror layer. The individual sublayers of the dielectric mirror layer are not explicitly shown for simplified representation.

By the dielectric mirror layer 65 a radiation absorption at the second contact layer 4 can be avoided. This is illustrated by an arrow 8 that indicates radiation reflected at the dielectric mirror layer 65. Furthermore, the dielectric mirror layer 65 also covers the side surface 250 of the recess 25. This prevents radiation escaping through this side surface from being absorbed at the first contact layer 3 or at the second contact layer 4.

In particular, the dielectric mirror layer is arranged in regions between the insulation layer 6 and the semiconductor body 2. Furthermore, the dielectric mirror layer 65 runs in places in a vertical direction between the current distribution layer 51 and the connection layer 52. Deviating from this, the dielectric mirror layer 65 and the connection layer 52 can also be arranged without overlapping. The current distribution layer 51 can completely cover the dielectric mirror layer 65 in plan view of the semiconductor chip.

Figure 2A:
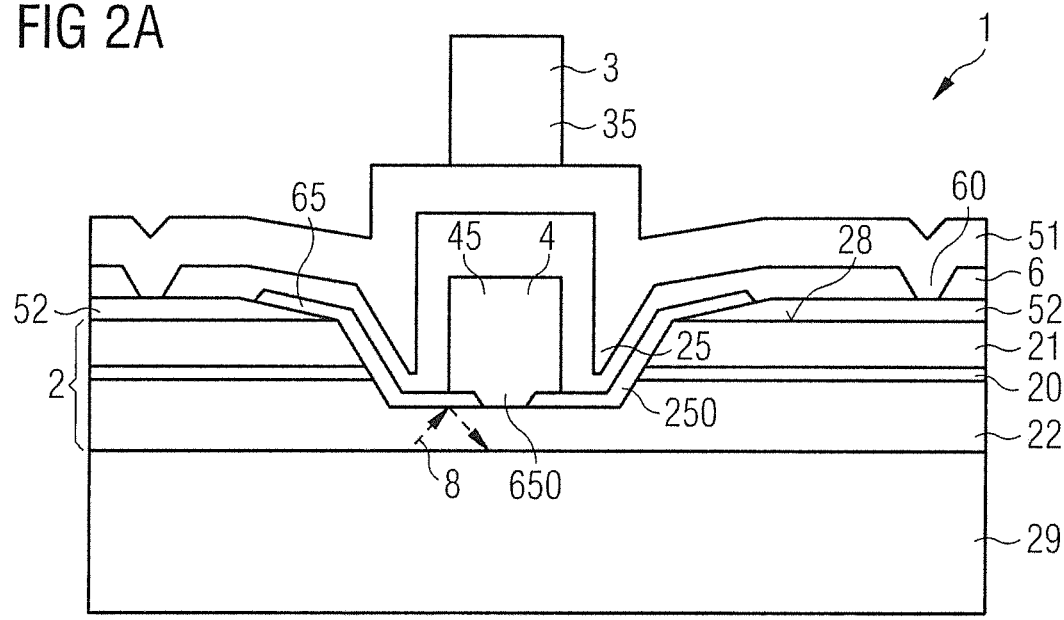
FIGS. 2A and 2B each show an example of a radiation-emitting semiconductor chip in a schematic cross-sectional view.
Figure 2B:
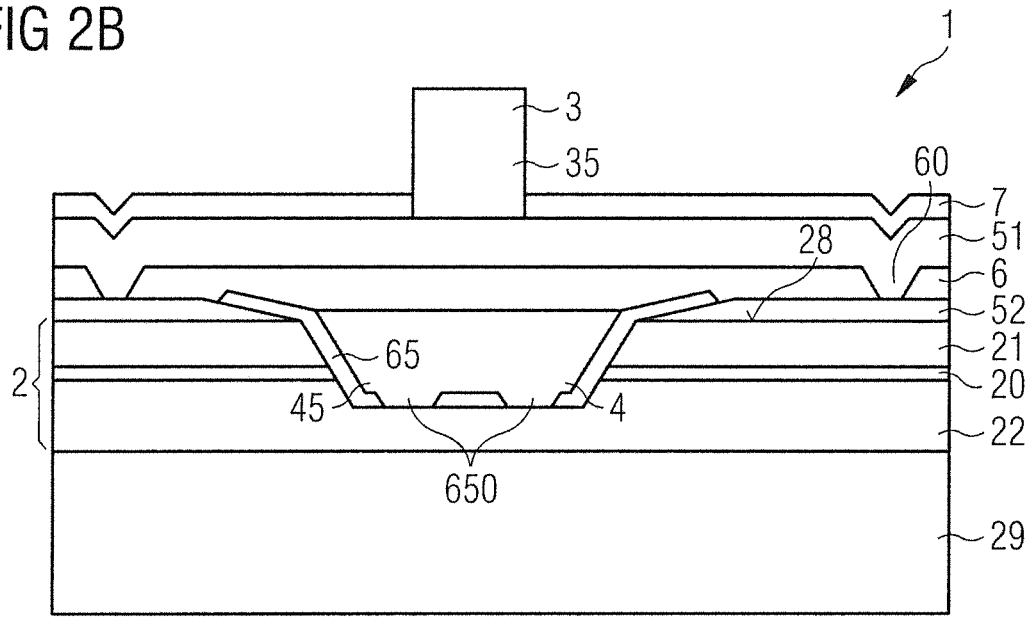

The example shown in FIG. 2B is essentially the same as the second example described in FIG. 2A.

In contrast, the recess 25 is completely or at least almost completely filled with material of the dielectric mirror layer 65 and the second contact layer 4. In this example, the electrical contacting of the second semiconductor layer 22 is carried out via adjacent cutouts 650 of the dielectric mirror layer 65.

Preferably, the lateral extension of the cutouts 650 is also limited along a lateral main extension direction of the associated contact web of the second contact web structure 45. The cutouts are thus surrounded along their entire circumference by material of the dielectric mirror layer. In other words, the second contact web structure 45 may be completely underlaid with material of the dielectric mirror layer at least at some places along the main extension direction of the associated contact web in a lateral transverse direction to the main extension direction of the contact web. Radiation absorption losses at the second contact layer 4 can thus be further reduced.

Furthermore, FIG. 2B shows a passivation layer 7 on the side of the semiconductor body 2 facing away from the carrier 29. This passivation layer can also be used in the example shown in FIGS. 1A and 2A.

In the lateral direction, the contact finger of the first contact web structure 35 overlapping with the recess 25 has a smaller lateral extent than the associated contact finger of the second contact web structure 45. Absorption losses at the second contact web structure can thus be further reduced.

In the following examples, plan views are shown that in particular show the course of the first contact web structure 35 and the second contact web structure 45. In a sectional view, the following examples can be formed in particular as described in connection with FIG. 1A, 2A or 2B. The position of the openings 60 is not shown in the following figures for simplified representation. These can be formed and/or arranged as described in FIG. 1B.

Figure 3:
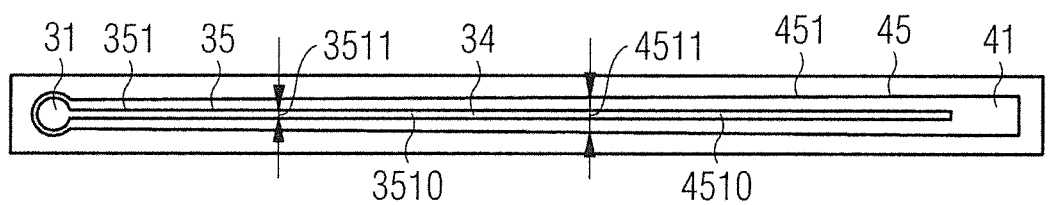
FIG. 3 shows an example of a radiation-emitting semiconductor chip in schematic plan view.

The example shown in FIG. 3 essentially corresponds to the example described in connection with FIGS. 1A to 1C. In contrast, the transverse extent 3511 of the first contact web 351 decreases with increasing distance from the first contact surface 31. Accordingly, the transverse extent 4511 of the second contact web 451 decreases with increasing distance from the second contact surface 41. The current flow in the metallic conductors, i.e., in the first contact web structure 35 and the second contact web structure 45, is controlled by the respectively tapering stacked current webs. In particular, the cross section of the contact webs is highest at the places where the current through the contact webs is highest.

The first contact surface 31 and the second contact surface 41 do not necessarily each have to be arranged at the edge of the radiation-emitting semiconductor chip 1.

Figure 4A:
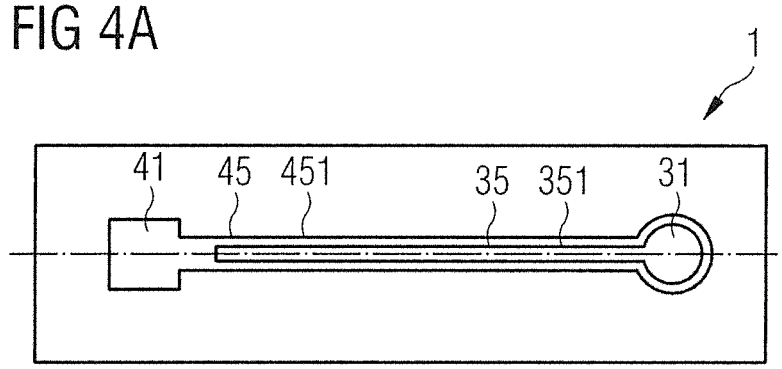
FIGS. 4A and 4B each show an example of a radiation-emitting semiconductor chip in schematic plan view.
Figure 4B:
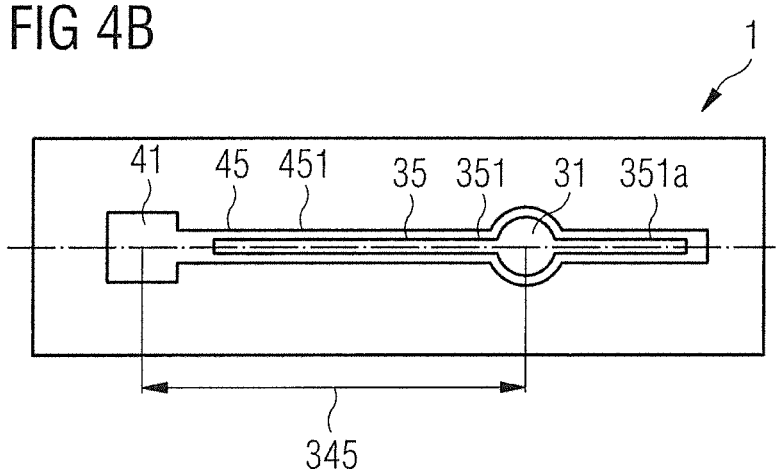

This is illustrated by FIGS. 4A and 4B. In the example shown in FIG. 4, the first contact web structure 35 has a further first contact web 351a extending from the first contact surface 31 in a direction away from the second contact surface 41. Part of the first contact web structure 35 is therefore further away from the second contact surface 41 than the first contact surface 31.

A center distance 345 between the first contact surface 31 and the second contact surface 41 is preferably at least one fifth of the extent of the radiation-emitting semiconductor chip along that direction.

The second contact web 451 continues over the first contact surface 31 as seen from the second contact surface 41 so that the further first contact web 351a bears on the second contact web 451 of the second contact web structure 451.

Figure 5A:
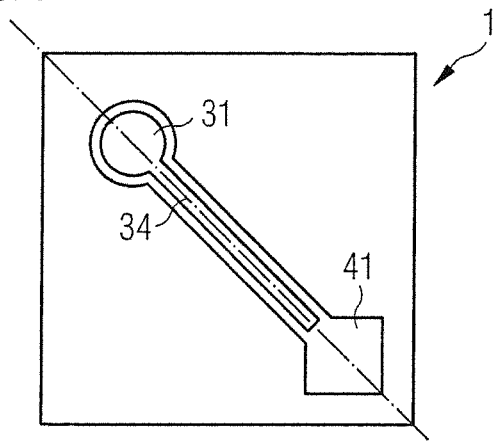
FIGS. 5A, 5B and 5C each show an example of a radiation-emitting semiconductor chip in schematic plan view.
Figure 5B:
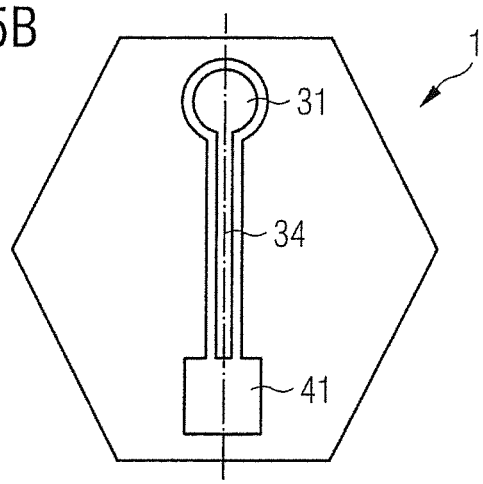
Figure 5C:
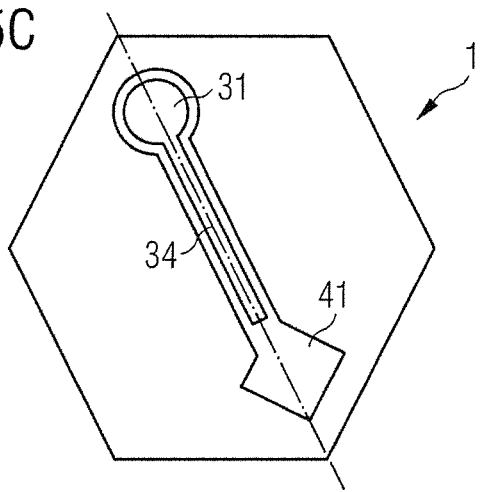

However, the structure of the radiation-emitting semiconductor chip described above is also suitable for radiation-emitting semiconductor chips with a length-to-width ratio of 2:1 or less, in particular also for a length-to-width ratio of 1:1. FIG. 5A shows an example of a squared radiation-emitting semiconductor chip. The connecting straight line 34 between the first contact surface 31 and the second contact surface 41 runs along a diagonal of the radiation-emitting semiconductor chip. Other basic forms of radiation-emitting semiconductor chips can also be used such as hexagonal basic forms as shown in FIGS. 5B and 5C. With such a basic shape, there are several possibilities for positioning the first contact surface 31 and the second contact surface 41. For example, as shown in FIG. 5C, the connecting straight line 34 can run through the corners of the hexagonal basic shape or through the edge center (FIG. 5B).

Figure 6A:
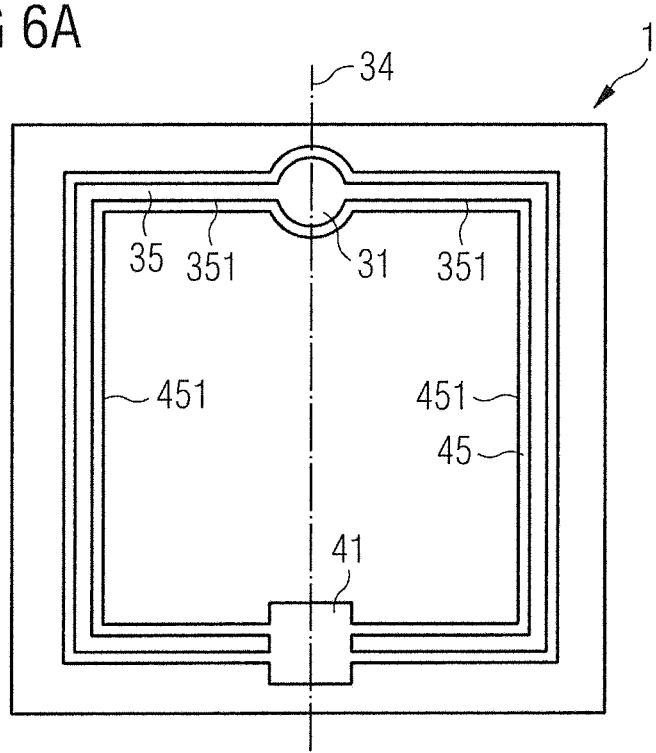
FIGS. 6A and 6B each show an example of a radiation-emitting semiconductor chip in schematic plan view.
Figure 6B:
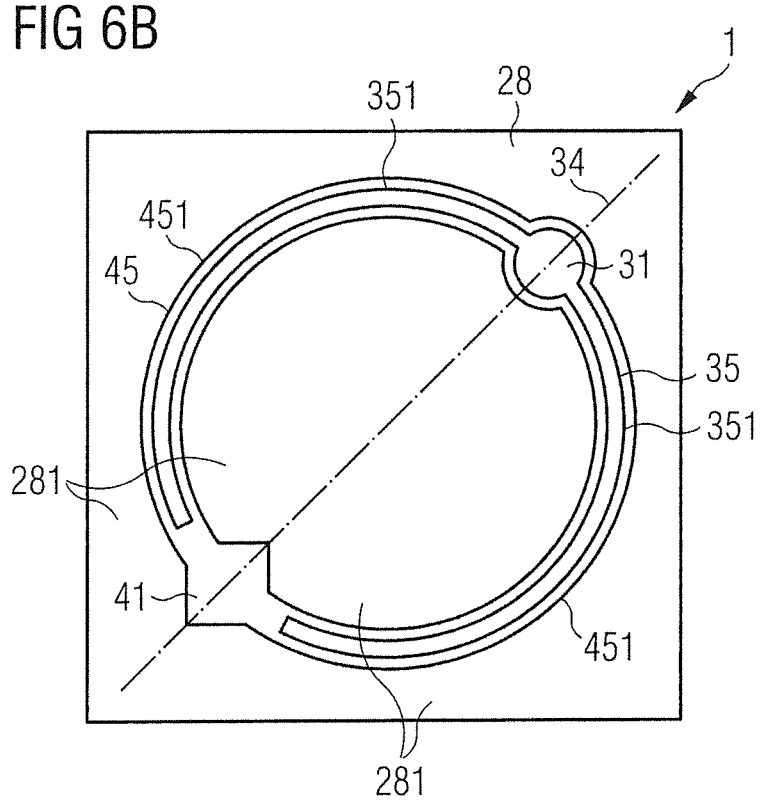

FIGS. 6A and 6B show two examples of a radiation-emitting semiconductor chip, with the first contact web structure 35 and the second contact web structure 45 each having two first contact webs 351 and two second contact webs 451, respectively. The second contact web structure 45 and the connecting straight line 34 divide a radiation exit surface 28 of the semiconductor body into partial surfaces 281. A size of the largest partial surface is larger by at most 50%, preferably by at most 25% or by at most 10% than a size of the smallest partial surface. In particular, all partial surfaces can be of the same size or essentially the same size.

The first contact web structure 35 and the second contact web structure 45 have a closed or at least largely closed basic form such as a frame-shaped basic form (FIG. 6A) or ring-shaped basic form (FIG. 6B). Such a configuration of the contact web structures is suitable, for example, for radiation-emitting semiconductor chips with an area of 0.25 to 0.5 mm$^2$ and a length-to-width ratio of 1:1 to 5:1.

The surfaces on both sides of the connecting straight line 34 forming an axis of symmetry are thus the same or at least almost the same. Furthermore, the surfaces within the second contact web structure 45 and the surfaces outside the second contact web structure 45 do not differ or do not differ significantly.

Figure 7A:
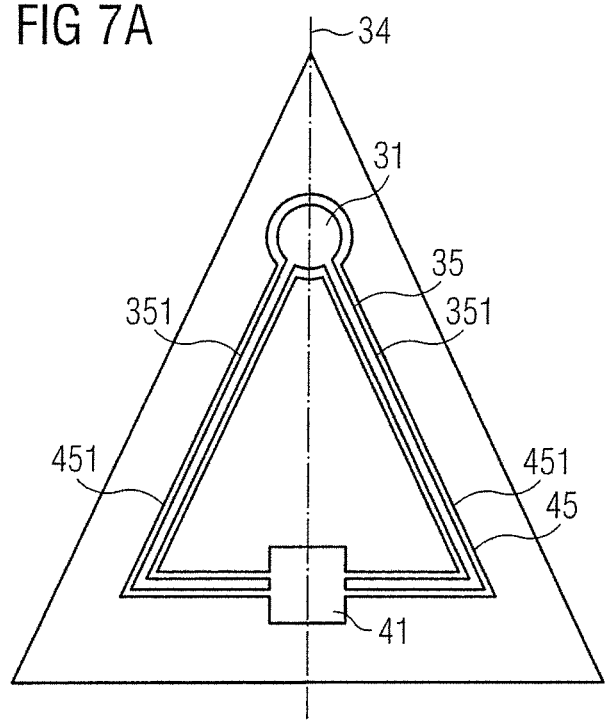
FIGS. 7A and 7B each show an example of a radiation-emitting semiconductor chip in schematic plan view.
Figure 7B:
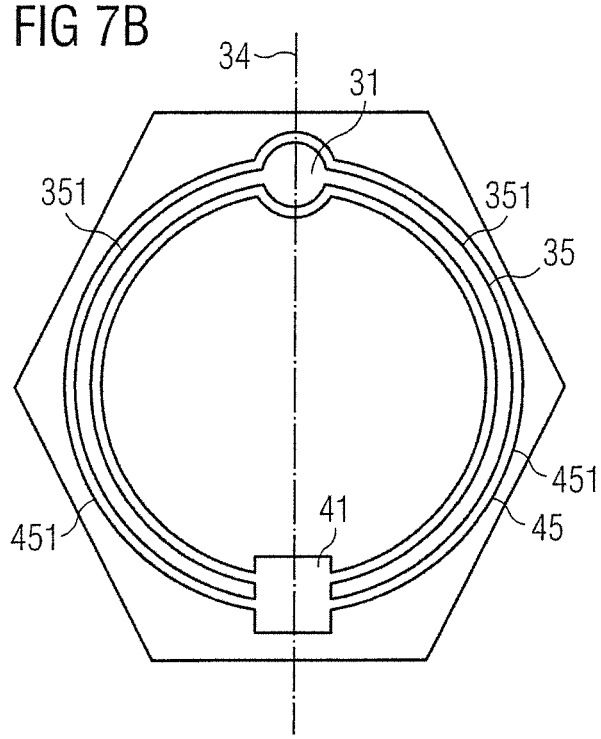

Furthermore, as shown in FIG. 7A, the radiation-emitting semiconductor chip 1 may also have another polygonal, exemplarily triangular basic shape. For example, the contact webs of the contact web structures run parallel to the edges of the radiation-emitting semiconductor chip at least in places or along their entire longitudinal axis. However, this is not necessary. For example, FIG. 7B shows an example in which the radiation-emitting semiconductor chip 1 has a hexagonal basic shape, while the first contact web structure 35 and the contact web structure 45 have an annular basic shape, i.e., a curved basic shape.

Figure 8A:
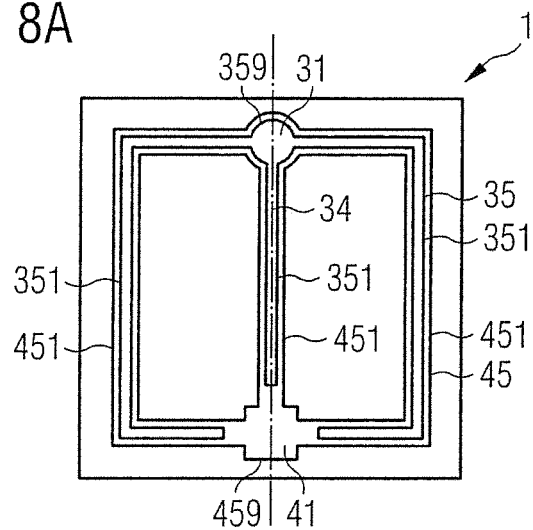
FIGS. 8A, 8B and 8C each show an example of a radiation-emitting semiconductor chip in schematic plan view.
Figure 8B:
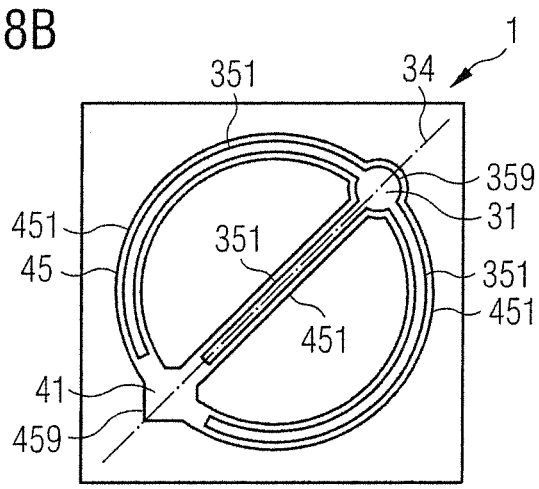
Figure 8C:
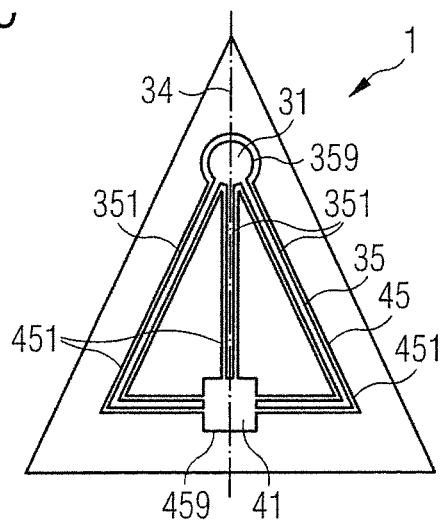

FIGS. 8A, 8B, and 8C show examples of radiation-emitting semiconductor chip structures where the first contact web structure 35 has a node 359 and the second contact web structure 45 has a node 459. As seen from the nodes, three first contact webs 351 and three second contact webs 451 extend away. The nodes 359, 459 are formed by the first contact surface 31 and the second contact surface 41, respectively. The first contact surface 31 and the second contact surface 41 are thus each formed at places where there is already a comparatively large material coverage with material from the first contact layer or the second contact layer. All in all, this minimizes the material coverage of the radiation exit surface with the material of the contact layers.

Figure 9A:
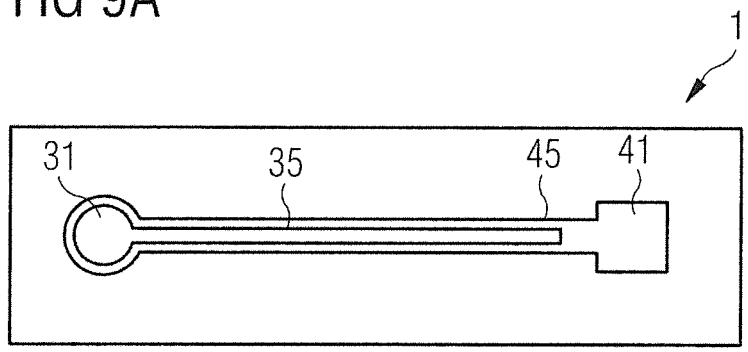
FIGS. 9A and 9B show an example of a radiation-emitting semiconductor chip (FIG. 9A) and a simulation result for a comparison structure (FIG. 9B).
Figure 9B:
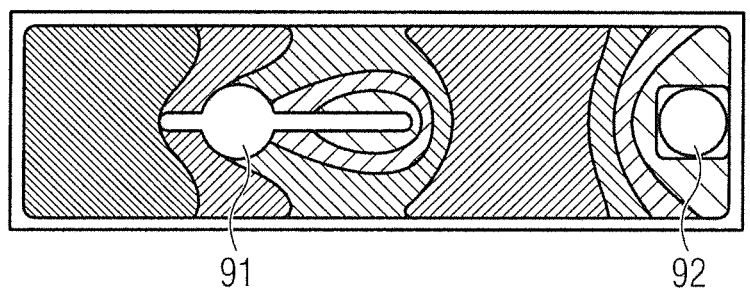

Simulation results of the lateral current density distribution for a comparison structure are shown in FIG. 9B, while FIG. 9A represents a radiation-emitting semiconductor chip 1 described above. In the simulation results, regions of the semiconductor chip with high current density are bright (slightly hatched) and regions with low current density are dark (more strongly hatched).

In the comparison structure of a semiconductor chip shown in FIG. 9B, a first contact structure 91 and a second contact structure 92 are arranged next to one another without overlapping. Only the first contact structure 91 has contact webs that extend away from the contact surface. In the example shown, the current extent on the side of the second contact structure 92 has a limiting effect so that a current density drop occurs starting from the second contact structure 92. Therefore, there is no laterally homogeneous current injection. In particular, the current injection on the side of the first contact structure facing away from the second contact structure is very low compared to the region around the second contact structure, resulting in a highly inhomogeneous luminance distribution.

By the radiation-emitting semiconductor chip described, a particularly high homogeneity of the current density distribution in the lateral direction can be achieved. This increases the freedom to choose the geometry of the semiconductor chip. In particular, semiconductor chips can be realized that are characterized by a high homogeneity of the current density distribution even with a length-to-width ratio that can be scaled almost arbitrarily, for example, 4:1 or more.

The priority of DE 10 2017 129 783.9 is claimed, the subject matter of which is hereby expressly incorporated by reference.

Our chips are not limited by the description of the examples. Rather, this disclosure includes any new feature and any combination of features that in particular includes any combination of features in the appended claims, even the feature or combination itself is not explicitly mentioned in the claims or the examples.

The invention claimed is:

1. A radiation-emitting semiconductor chip comprising:
a semiconductor body having an active region that generates radiation;
a first contact layer having a first contact surface for external electrical contacting of the semiconductor chip and a first contact web structure connected to the first contact surface, wherein the first contact web structure is a region of the first contact layer that, compared to the first contact surface, has a comparatively small extent at least in a lateral direction;
a second contact layer having a second contact surface for external electrical contacting of the semiconductor chip and a second contact web structure connected to the second contact surface, wherein 1) the first contact web structure and the second contact web structure overlap in places in plan view of the semiconductor chip, 2) the first contact layer, the second contact layer and a radiation exit surface are arranged at a same side on the semiconductor body, 3) the first contact layer, the second contact layer, the radiation exit surface and a radiation exit side of the semiconductor chip are arranged at the same side of the semiconductor chip, and 4) the radiation is visible light, is produced in the active region and exits the semiconductor chip through the radiation exit surface and the radiation exit side;
a current distribution layer through which a first semiconductor layer electrically conductively connects to the first contact layer; and
an insulation layer containing a dielectric material, wherein the insulation layer is arranged between the first semiconductor layer and the current distribution layer and has a plurality of openings into which the current distribution layer extends, and a diameter of the openings is 1 μm to 20 μm.

2. The radiation-emitting semiconductor chip according to claim 1, wherein the radiation-emitting semiconductor chip has a length to width ratio of at least 4:1.

3. The radiation-emitting semiconductor chip according to claim 1, wherein the radiation-emitting semiconductor chip has a length to width ratio of at least 6:1.

4. The radiation-emitting semiconductor chip according to claim 1, wherein the first contact web structure and/or the second contact web structure is formed symmetrically to a connecting straight line through the first contact surface and the second contact surface.

5. The radiation-emitting semiconductor chip according to claim 1, wherein a transverse extent of at least one contact web of the first contact web structure and/or the second contact web structure decreases with increasing distance from the associated contact surface.

6. The radiation-emitting semiconductor chip according to claim 1, wherein the second contact web structure and a connecting straight line through the first contact surface and the second contact surface divide a radiation exit surface of the semiconductor body into a plurality of partial surfaces, in which a size of the largest partial surface is larger by at most 50% than a size of the smallest partial surface.

7. The radiation-emitting semiconductor chip according to claim 1, wherein the first contact web structure and/or the second contact web structure has a node from which at least three contact webs branch off, and the first contact surface and/or the second contact surface forms the node.

8. The radiation-emitting semiconductor chip according to claim 1, wherein an electrical surface resistance of the current distribution layer is at most three times as large as an electrical surface resistance of a second semiconductor layer.

9. The radiation-emitting semiconductor chip according to claim 1, wherein a center distance between the first contact surface and the second contact surface is at least ⅕ of the length of the semiconductor chip.

10. The radiation-emitting semiconductor chip according to claim 1, wherein at least one contact web extends from the first contact surface in a direction away from the second contact surface or vice versa.

11. The radiation-emitting semiconductor chip according to claim 1, wherein the insulation layer is formed as a filter layer that predominantly transmits incident radiation within a first angular range and predominantly reflects incident radiation within a second angular range.

12. The radiation-emitting semiconductor chip according to claim 1, wherein the first contact surface and the second contact surface are accessible for external electrical contacting from a radiation exit surface of the semiconductor body.

13. The radiation-emitting semiconductor chip according to claim 1, wherein at least 50% of the total area of the second contact web structure overlaps the first contact web structure.

14. The radiation-emitting semiconductor chip according to claim 1, wherein the insulation layer is arranged between the first contact layer and the second contact layer.

15. The radiation-emitting semiconductor chip according to claim 1, wherein there is at no place of the semiconductor chip a direct vertical current path between the first contact layer and the semiconductor body.

16. A radiation-emitting semiconductor chip comprising:
a semiconductor body having an active region that generates radiation;
a first contact layer having a first contact surface for external electrical contacting of the semiconductor chip and a first contact web structure connected to the first contact surface;
a second contact layer having a second contact surface for external electrical contacting of the semiconductor chip and a second contact web structure connected to the second contact surface, wherein 1) the first contact web structure and the second contact web structure overlap in places in plan view of the semiconductor chip, wherein 2) the first contact layer, the second contact layer and a radiation exit surface are arranged at a same side on the semiconductor body, 3) the first contact layer, the second contact layer, the radiation exit surface and a radiation exit side of the semiconductor chip are arranged at the same side of the semiconductor chip, and 4) the radiation is visible light, is produced in the active region and exits the semiconductor chip through the radiation exit surface and the radiation exit side;
a current distribution layer through which a first semiconductor layer electrically conductively connects to the first contact layer; and
an insulation layer containing a dielectric material, wherein the insulation layer is arranged between the first semiconductor layer and the current distribution layer and has a plurality of openings into which the current distribution layer extends, and the insulation layer is formed as a filter layer that predominantly transmits an incident radiation within a first angular range and predominantly reflects the incident radiation within a second angular range.

17. The radiation-emitting semiconductor chip according to claim 16, wherein at least 60% of the incident radiation is transmitted.

18. A radiation-emitting semiconductor chip comprising:
a semiconductor body having an active region that generates radiation;
a first contact layer having a first contact surface for external electrical contacting of the semiconductor chip and a first contact web structure connected to the first contact surface;
a second contact layer having a second contact surface for external electrical contacting of the semiconductor chip and a second contact web structure connected to the second contact surface, wherein 1) the first contact web structure and the second contact web structure overlap in places in plan view of the semiconductor chip, wherein 2) the first contact layer, the second contact layer and a radiation exit surface are arranged at a same side on the semiconductor body, 3) the first contact layer, the second contact layer, the radiation exit surface and a radiation exit side of the semiconductor chip are arranged at the same side of the semiconductor chip, and 4) the radiation is visible light, is produced in the active region and exits the semiconductor chip through the radiation exit surface and the radiation exit side;
a current distribution layer through which a first semiconductor layer electrically conductively connects to the first contact layer; and
an insulation layer containing a dielectric material and arranged between the first semiconductor layer and the current distribution layer and has a plurality of openings into which the current distribution layer extends, and the openings differ in shape and/or size from one another.

19. The radiation-emitting semiconductor chip according to claim 18, wherein a distribution density of the openings is 200000 openings per $mm^2$ to 10 openings per $mm^2$.

20. The radiation-emitting semiconductor chip according to claim 18, wherein one or more of the openings provided at an edge of the semiconductor chip are larger than openings in a middle portion of the semiconductor chip.

* * * * *